(12) United States Patent
Zia et al.

(10) Patent No.: US 7,309,628 B2
(45) Date of Patent: Dec. 18, 2007

(54) METHOD OF FORMING A SEMICONDUCTOR DEVICE

(76) Inventors: Omar Zia, 605 E. 43rd St., Austin, TX (US) 78751; Hsiao-Hui Chen, 16928 Cactus Blossom Dr., Pflugerville, TX (US) 78660; Lawrence Cary Gunn, III, 1385 Hymettus Ave., Encinitas, CA (US) 92024

( * ) Notice: Subject to any disclaimer, the term of this patent is extended or adjusted under 35 U.S.C. 154(b) by 327 days.

(21) Appl. No.: 10/989,937

(22) Filed: Nov. 15, 2004
(Under 37 CFR 1.47)

(65) Prior Publication Data
US 2006/0105563 A1 May 18, 2006

(51) Int. Cl.
*H01L 21/8238* (2006.01)
(52) U.S. Cl. .................. 438/199; 438/618; 438/622; 257/127; 257/204; 257/E27.046; 257/E21.632
(58) Field of Classification Search ................ 257/409, 257/127, 204, E27.046, E27.108, E27.064, 257/E21.632; 438/29, 618, 622, 637
See application file for complete search history.

(56) References Cited

U.S. PATENT DOCUMENTS

| 6,608,945 | B2 | 8/2003 | Deliwala |
| 6,654,511 | B2* | 11/2003 | Deliwala ................. 385/2 |
| 6,687,446 | B2 | 2/2004 | Arakawa |
| 6,835,648 | B2* | 12/2004 | Hong et al. ............. 438/622 |
| 2002/0164122 | A1 | 11/2002 | Taylor, Jr. |
| 2003/0063885 | A1 | 4/2003 | Gunn, III |
| 2003/0235370 | A1 | 12/2003 | Taillaert |
| 2004/0262763 | A1* | 12/2004 | Windlass et al. ......... 257/758 |
| 2005/0127495 | A1* | 6/2005 | Zhang et al. ............ 257/700 |
| 2005/0189612 | A1* | 9/2005 | Hung et al. .............. 257/529 |
| 2005/0239273 | A1* | 10/2005 | Yang ....................... 438/601 |
| 2006/0292711 | A1* | 12/2006 | Su et al. .................... 438/14 |

FOREIGN PATENT DOCUMENTS

| WO | WO02/14915 A2 | 2/2002 |
| WO | WO03/023469 A1 | 3/2003 |
| WO | WO03/023476 A1 | 3/2003 |

OTHER PUBLICATIONS

Fischer et al., "0.1 dB/cm Waveguide Losses in Single-Mode SOI Rib Waveguides," IEEE Photonics Technology Letters, vol. 8, No. 5, May 1996, pp. 647-648.

* cited by examiner

*Primary Examiner*—Thao P. Le
(74) *Attorney, Agent, or Firm*—Michael J. Balconi-Lamica; James L. Clingan, Jr.

(57) ABSTRACT

A semiconductor device is formed as part of an integrated circuit. The semiconductor device, which is formed in an active semiconductor layer, is surrounded by a guardian that provides a diffusion barrier against contaminants and also provides assistance in avoiding dishing above the semiconductor device during chemical mechanical polishing. The dielectric that is above the semiconductor device and inside the guardian is etched to form an opening that receives one of an optical fiber, an electromagnetic signal source, or an electromagnetic signal load. The remaining dielectric is in layers that are of substantially uniform thickness. The guardian is built up in layers that are part of a normal integrated circuit process. These include contact layers, via layers, and interconnect layers.

6 Claims, 4 Drawing Sheets

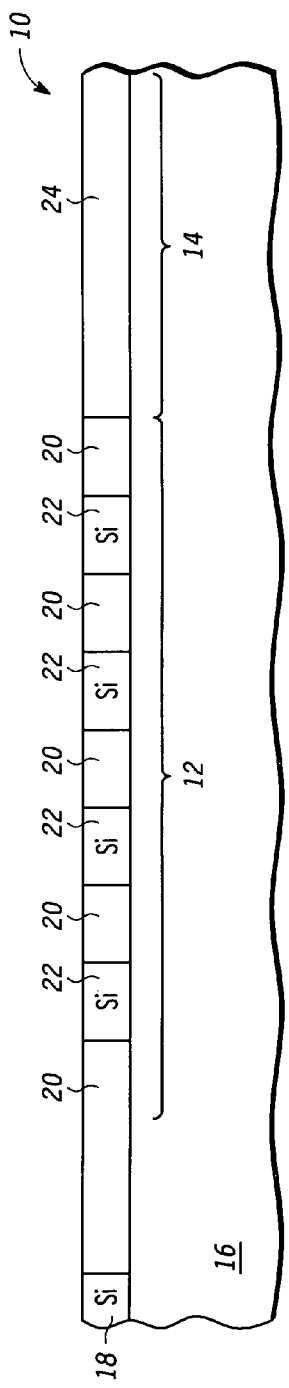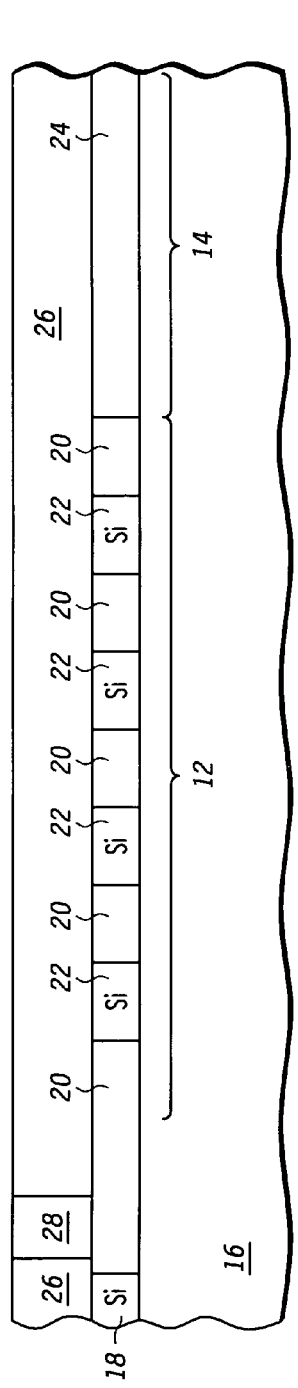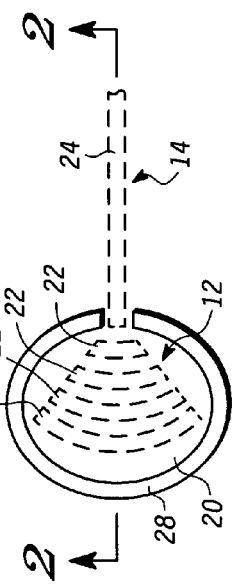

US 7,309,628 B2

METHOD OF FORMING A SEMICONDUCTOR DEVICE

BACKGROUND

The present embodiments relate to a method of forming a semiconductor device, and more particularly, to a method of forming a controlled dielectric stack on top of a semiconductor device.

In the present art, it is known that electromagnetic signals have important interactions with materials in a conventional CMOS process. Whether these signals be optical, in the form of guided or free-space light, or longer wavelength in nature, the control of dielectric constant, film thickness as well as the presence or lack thereof of metals in an associated semiconductor device is fundamental to ensuring device performance. Methods to improve the controllability of these physical layers serve to improve the manufacturability of any of such devices.

In one aspect, impinging radiation or guided radiation interacts with the back end dielectric stack of a conventional CMOS process. This radiation may be traveling along the wafer's surface through the dielectric, as in the case of a transmission line, or in another embodiment, it could be traveling normal to the film stack to interact with an underlying device. One such device is a grating coupler. Grating couplers on silicon are discussed in literature, wherein the grating couplers diffract light at normal incidence into a waveguide on a silicon surface. However, while such grating coupler structures have been theoretically simulated, they are not known to have been demonstrated in an optimized CMOS process manufacturing environment. In such a demonstration, the impinging radiation would need to travel through a highly uniform and controllable back-end dielectric stack to arrive at its destination, which may be in the form of a guided wave traveling perpendicular to the wafer's surface. Ideally, electromagnetic signal can not interact with parasitic metal. CMP non-uniformity resulting from the inability to use state-of-the-art metal tiling algorithms associated with such devices in the overlying ILD layers could reduce the efficiency of such devices.

Accordingly, it would be desirable to provide a method for manufacturing a semiconductor device, such as a grating coupler structure, an electromagnetic receiver or transmitter, or waveguide for overcoming aforementioned problems in the art.

SUMMARY

According to one embodiment of the present disclosure, a method comprises providing a semiconductor substrate; forming a semiconductor device in the semiconductor substrate; and forming a guardian feature around the overlying dielectric layers.

BRIEF DESCRIPTION OF THE DRAWINGS

The embodiments of the present disclosure are illustrated by way of example and not limited by the accompanying figures, in which like references indicate similar elements, and in which:

FIG. 1 is a cross-sectional view of a portion of an optical device prior to forming a guardian feature of a semiconductor device during manufacturing thereof according to one embodiment of the present disclosure;

FIG. 2 is a cross-sectional view of the portion of the semiconductor device having a contact portion of the guardian feature during further manufacturing thereof;

FIG. 3 is a top layout view of the portion of the optical coupler with the contact portion of the guardian feature of FIG. 2;

Figure 4:
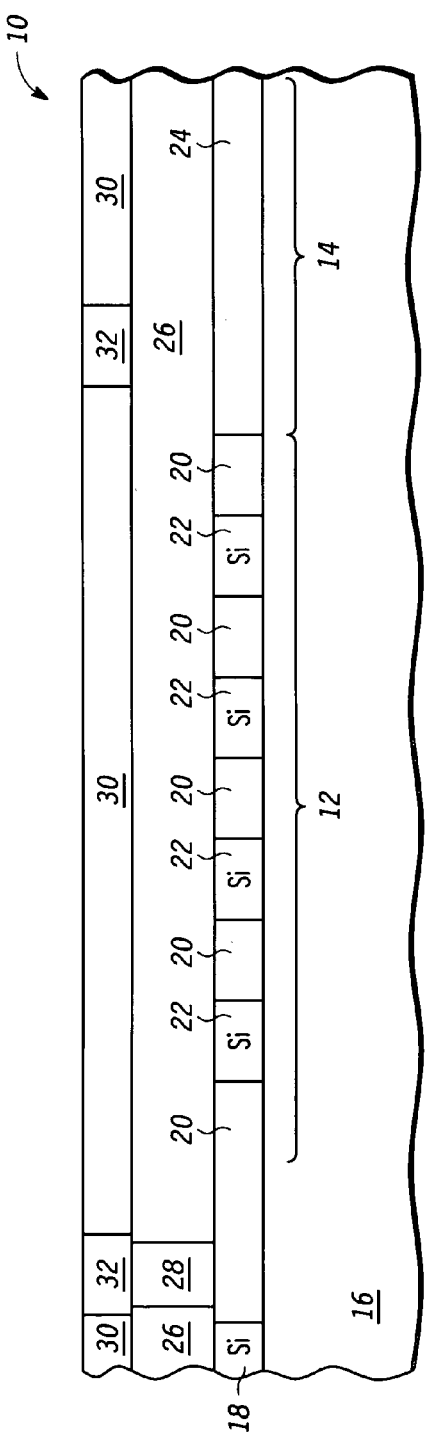
FIG. 4 is a cross-sectional view of the portion of the semiconductor device having a metal-1 portion of the guardian feature during further manufacturing thereof.

The use of the same reference symbols in different drawings indicates similar or identical items. Skilled artisans will also appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Semiconductor devices which receive electromagnetic signals as inputs are known in the art. In one embodiment, such a signal impinges upon a device, located in the silicon of an SOI wafer. Such a device may be an optical coupler, photodetector or photo-transistor. Coupling the signal into the device at normal incidence provides a better scheme than attempting to align one or more sources (by way of an optical fiber, as an example) to a cleaved wafer facet. In addition, normal incidence input provides a type of "electromagnetic" bond pad for an semiconductor device or devices that may incorporate a grating coupler to couple this impinging signal into a guided mode on the wafer's surface for the application of routing optical signals on-chip. Furthermore, such a structure provides a very cost effective way of in-line probing of the device or devices that incorporate such a structure. Of crucial importance is the control of the dielectric stack, existing in industry grade CMOS processing, through which such a signal will propagate. Accordingly, a method of forming a semiconductor device having a guardian feature is disclosed herein which enhances the manufacturability and reliability of a semiconductor device on silicon which interacts with a normal incidence electromagnetic signal that is compatible with industry grade CMOS processing.

FIG. 1 is a cross-sectional view of a portion of a semiconductor device prior to forming a guardian feature of a semiconductor device during manufacturing thereof according to one embodiment of the present disclosure. A semiconductor device 10 includes two portions, the first portion 12 including a series of alternating features and a second portion 14 including perpendicular features, both patterned in the plane of the wafer. Semiconductor device 10 is formed, for example, beginning with a semiconductor-on-insulator (SOI) substrate, the SOI substrate including buried oxide (BOX) layer 16 with an active semiconductor layer 18 overlying the BOX layer 16. In one embodiment, active semiconductor layer 18 comprises silicon. Device portion 12 includes regions of alternating low index of refraction and high index of refraction material forming a generalized optical grating in the illustrated embodiment. As illustrated, device portion 12 includes an alternating pattern of oxide regions 20 and silicon regions 22, formed within silicon layer 18. In addition, portion 14 includes a portion 24 of silicon layer 18, forming a waveguide or detector in the illustrated embodiment.

The angle of incidence of the electromagnetic signal can be optimized based upon the optical properties of the semiconductor device or vice versa. Furthermore, besides the use of an SOI substrate, the underlying substrate could also include any material stack designed to better reflect and thus capture the incident beam.

It is noted that the semiconductor device portion 12 can in fact be devoid of any particular feature, in the case where the electromagnetic signal is not intended to interact with one. In another embodiment, the device may comprise any arbitrarily designed periodic grating that diffracts electromagnetic signals from a fiber or radiation source into a waveguide or photo-detector or photo transistor. For example, one method of forming the periodic grating involves the use of a single etch to create the grating and the waveguide, furthermore using portions of a standard CMOS process on SOI. In another method, a polysilicon etch is used to form the grating. In yet another embodiment, the semiconductor device may be an antenna structure designed to either transmit or receive an electromagnetic signal. In all cases, during formation of the semiconductor device, attention is given to the underlying and overlying dielectric layers in connection with providing desired optical characteristics.

In other words, particular attention is paid to the layer thicknesses of the lower (BOX) and upper cladding (ILD) layers. While the thickness of the BOX is set by the wafer manufacturer, the ILD thickness uniformity is the result of chemical-mechanical polishing (CMP). The top cladding layer(s) must be designed to optimally transmit an electromagnetic signal efficiently into the semiconductor device if a complex stack is used, for example, as in a contact module, in the case of normal incidence. Thus, it is advantageous to incorporate a metal guardian feature around the semiconductor device to improve chemical-mechanical polishing (CMP) planarity issues that might otherwise interfere with the film stack above the semiconductor device. Accordingly, the guardian feature reduces undesirable dishing within upper cladding layers above the grating coupler device during one or more polishing steps, thus improving manufacturability. The bottom cladding layer may be a single BOX layer, or in an alternative embodiment, an alternating stack of low-high index materials designed as a reflector, depending on the needs of the overall device.

FIG. 2 is a cross-sectional view of one embodiment of such a semiconductor device portion 12 having a contact portion of the guardian feature during further manufacturing thereof. In particular, a first interlevel dielectric layer (ILD) 26 is deposited on the surface of the silicon layer 18, semiconductor device portion 12, and waveguide 14. ILD layer 26 may include a single ILD layer or a stack of films forming a desired composition making up the ILD layer. In addition, subsequent to depositing the ILD layer, the layer can be planarized to a desired thickness, for example, via chemical-mechanical polishing. The desired ILD composition and ILD thickness are determined according to the particular requirements of the semiconductor device being manufactured. The first ILD layer 16 also functions as an upper cladding layer for the optical device 10. While ILD has been described as being deposited, the same could also be formed for example, by spin-on or other suitable methods.

Subsequent to forming ILD layer 26, a first guardian contact 28 of a guardian feature is formed within the ILD layer 26. In one embodiment, the first guardian contact 28 is formed using a patterning and etching process to define an opening which is subsequently filled with a desired guardian contact material. The desired guardian contact material is selected according to the particular requirements of the optical device being manufactured. For example, guardian contact material can include metal, or other suitable material selected according to the particular requirements of the optical device application.

After formation of the ILD layer 26 and filling the opening with material of the first guardian contact 28, the surface of the ILD layer and the first guardian contact are planarized using, for example, chemical-mechanical polishing. In one embodiment, the formation of first guardian contact is accomplished via a damascene process, as discussed herein. Alternatively, the first guardian contact can be formed using a deposition and etch-back process.

FIG. 3 is a top layout view of the portion of the semiconductor device with the contact portion of the guardian feature of FIG. 2. The semiconductor device portion 12 is illustrated as a pattern of regions of alternating low index of refraction material 20 and high index of refraction material 22. Device portion 14 is illustrated as a linear region of silicon material 24. Device portions 12 and 14 could also include other shapes, patterns, or configurations as may be required for a particular semiconductor or optical device application. Furthermore, the semiconductor device 10 could also include one or more optical couplers or one or more waveguides.

Further with respect to FIG. 3, the first guardian contact 28 is formed within the first ILD layer 26 to partially surround an area overlying the semiconductor device portion 12. In one embodiment, the first guardian contact 28 substantially surrounds the area of the semiconductor device portion 12, leaving a portion of the ILD layer 26 overlying the semiconductor device portion 14 absent of the first guardian contact 28. In other words, the first guardian contact 28 comprises a first metal layer formed substantially around and adjacent to the semiconductor device portion 12 while leaving a portion of the first dielectric layer 26 over the semiconductor device portion 12. The minimal proximity of the first guardian contact 28 to the semiconductor device portion 12 and semiconductor device portion 14 is selected to substantially eliminate or minimize any undesirable optical interference between the same. In another embodiment, one or more semiconductor device portions 12 may be present within silicon layer 18. In such an instance, the first guardian contact 28 can be configured to substantially surround the area of the one or more optical couplers, but be absent from the portion of the ILD layer 26 that overlies a waveguide. In yet another embodiment, one or more semiconductor device portions 14 may be present within silicon layer 18. In such an instance, the first guardian contact 28 can be configured to substantially surround the area of the semiconductor device portions 12, but be absent from one or more portions of the ILD layer 26 that overlie one or more waveguides.

Referring still to FIG. 3, the first guardian contact 28 includes a circular shape having a single discontinuity. The shape of first guardian contact 28 can also include one or more discontinuities selected according to the desired performance characteristics of the semiconductor device. Accordingly, the circular shape can include one or more discontinuous portions of the circular shape. Furthermore, one or more first guardian contacts 28 can be included within the first ILD layer 16, wherein the one or more first guardian contacts include concentric first guardian contacts. Moreover, the one or more first guardian contacts 28 can include another type shape or geometry determined according to the particular requirements of the semiconductor device being manufactured or the manufacturing process.

FIG. 4 is a cross-sectional view of the portion of the semiconductor device portion 12 having a metal-1 portion of the guardian feature during further manufacturing thereof. In particular, a second interlevel dielectric layer (ILD) 30 is deposited on the surface of the first interlevel dielectric layer 26. ILD layer 30 may include a single ILD layer or a stack of films forming a desired composition making up the ILD layer, the ILD layer having a desired thickness. The desired ILD composition and ILD thickness are determined according to the particular requirements of the semiconductor device being manufactured. For example, the first dielectric layer 26 has a first thickness and the second dielectric layer 30 has a second thickness, wherein the first thickness is substantially equal to the second thickness. The second ILD layer 30 may also function as an upper cladding layer for an optical device 10. While ILD has been described as being deposited, the same could also be formed for example, by spin-on or other suitable methods.

Subsequent to forming ILD layer 30, a metal-1 portion 32 of the guardian feature is formed within the ILD layer 30. In one embodiment, the metal-1 portion 32 of the guardian feature is formed using a patterning and etching process to define an opening which is subsequently filled with a desired metal-1 guardian material. The desired metal-1 guardian material is selected according to the particular requirements of the semiconductor device being manufactured. For example, metal-1 guardian material can include metal, or other suitable material selected according to the particular requirements of an optical device application.

After formation of the ILD layer 30 and filling the opening with the metal-1 guardian material 32, the surface of the ILD layer and the metal-1 guardian material are planarized using, for example, chemical-mechanical polishing. In one embodiment, the formation of metal-1 portion of the guardian feature is accomplished via a damascene process, as discussed herein. Alternatively, the metal-1 portion can be formed using a deposition and etch-back process.

Figure 5:
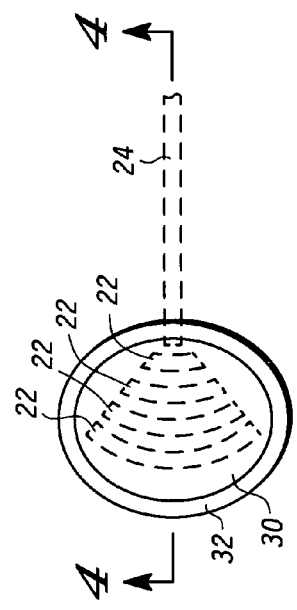
FIG. 5 is a top layout view of the portion of the semiconductor device having the metal-1 portion of the guardian feature of FIG. 4.

FIG. 5 is a top layout view of the portion of the semiconductor device with the metal-1 portion of the guardian feature of FIG. 4. The metal-1 portion 32 of the guardian feature is formed within the second ILD layer 30 to surround an area overlying the semiconductor device portion 12, and further to be in contact with the underlying first guardian contact 28. In another embodiment, one or more semiconductor device portions 12 may be present within silicon layer 18. In such an instance, the metal-1 portion 32 of the guardian feature can be configured to overlie first guardian contact 28.

Referring still to FIG. 5, the metal-1 portion 32 of the guardian feature includes a circular shape without having a discontinuity. Depending upon semiconductor device design and its requirements with respect to an electromagnetic signal, it may be necessary to leave a discontinuity in the metal above the waveguide if the radiation or evanescent wave substantially penetrates into the second ILD layer 30. In one embodiment, forming the metal-1 portion 32 of the guardian feature comprises forming a second metal layer over and substantially aligned to the first metal layer 28 and around the semiconductor device 12, leaving a portion of the second dielectric 30 over the semiconductor device 12.

The shape of metal-1 portion 32 of the guardian feature can also include one or more discontinuities selected according to the desired performance characteristics of the semiconductor device. Accordingly, the circular shape can include one or more discontinuous portions of the circular shape. Furthermore, one or more metal-1 guardian portions 32 can be included within the second ILD layer 30, wherein the one or more metal-1 guardian portions 32 include concentric metal-1 guardian portions. Moreover, the one or more metal-1 guardian portions 32 can include another type shape or geometry determined according to the particular requirements of the semiconductor device being manufactured or the manufacturing process.

Figure 6:
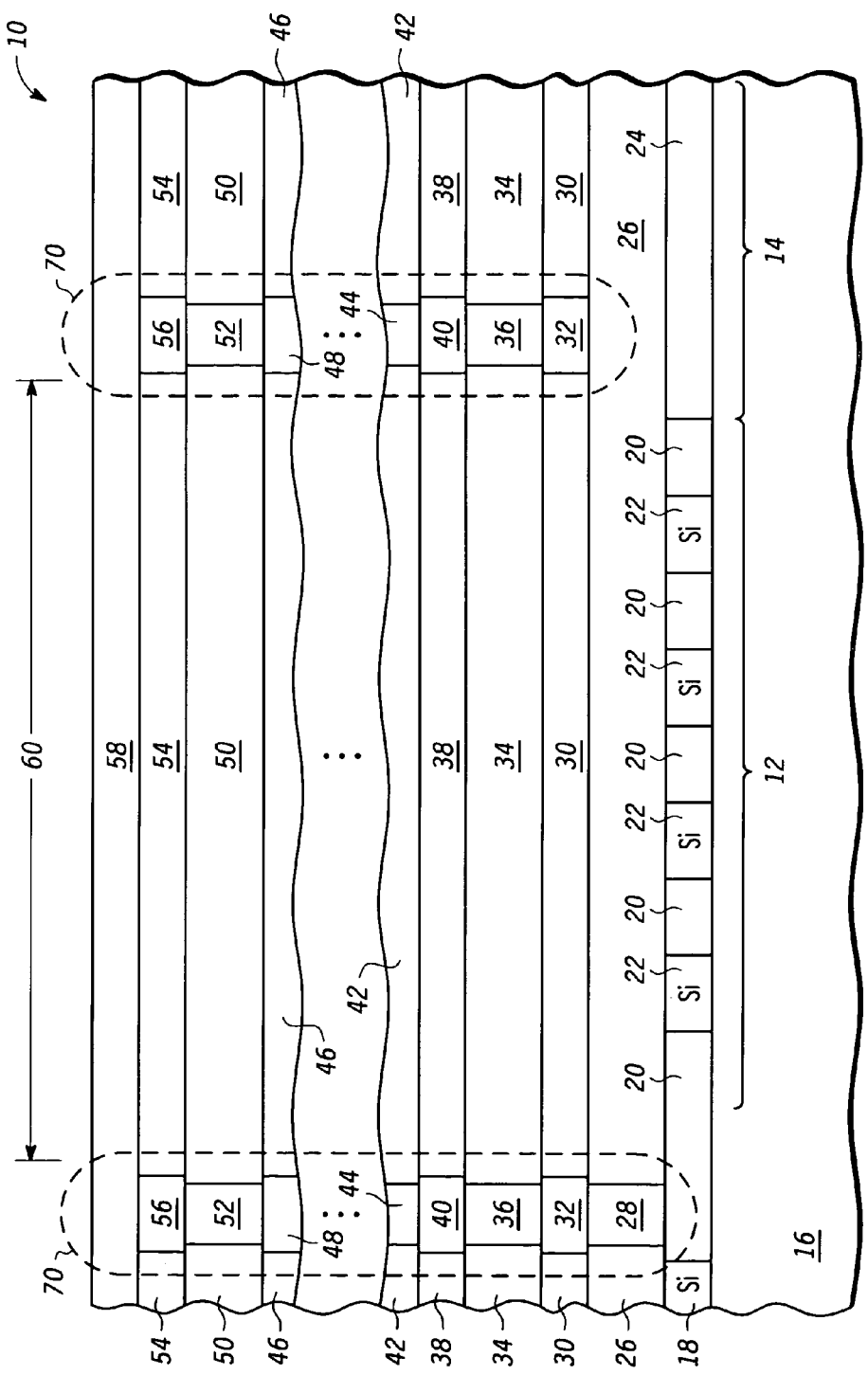
FIG. 6 is a cross-sectional view of the semiconductor device having the guardian feature during further manufacturing thereof according to one embodiment of the present disclosure.

FIG. 6 is a cross-sectional view of the semiconductor device having the guardian feature during further manufacturing thereof according to one embodiment of the present disclosure. In particular, FIG. 6 illustrates formation of subsequent ILD layers and via or metal portions of guardian feature 70. The metal via portions may also include metal interconnects of interconnect layers. In particular, a third interlevel dielectric layer (ILD) 34 and via-1 portion 36 are formed on the surface of the second interlevel dielectric layer 30. In one embodiment, forming the via-1 portion 36 of the guardian feature comprises forming a third metal layer over and substantially aligned to the second metal layer 32 and around the semiconductor device portion 12, leaving a portion of the third dielectric 34 over the semiconductor device portion 12.

In addition, a fourth interlevel dielectric layer (ILD) 38 and metal-2 portion 40 are formed on the surface of the third interlevel dielectric layer 34. A next interlevel dielectric layer (ILD) 42 and next via portion 44 are formed on the surface of the fourth interlevel dielectric layer 38. Additional layers can further be included, as indicated by the series of dots between layers 42 and 46, as well as, ILD layer 46 and next metal portion 48, ILD layer 50 and next via portion 52, and ILD layer 54 and last-metal portion 56.

Formation of the additional layers can be accomplished similarly as with the earlier formed ILD layers, via-portions of the guardian feature, and metal-portions of the guarding feature. The specific number of ILD layers, via-portions of the guardian feature, and metal-portions of the guardian feature are determined according to the particular requirements of the semiconductor device, or other potential integrated electrical devices. As discussed, one or more of the additional ILD layers may include single ILD layers or a stack of films forming a desired composition making up the respective ILD layer, further wherein the respective ILD layers have a desired thickness. Furthermore, the desired ILD composition and ILD thickness of the one or more additional ILD layers are determined according to the particular requirements of the semiconductor device being manufactured.

Subsequent to forming the ILD layer 54 and last-metal portion 56 of the guardian feature 70, a passivation layer 58 is formed overlying ILD layer 54. Passivation layer 58 can include any protective material of a single or multiple stack composition. Furthermore, passivation layer 58 protects the underlying structures from further back end of the line processing, packaging, and/or the environment, in general. According to the embodiments of the present disclosure, guardian feature 70 provides a window in a region indicated by the arrow 60 as shown in FIG. 6, through which electromagnetic radiation can travel. Guardian feature 70 is configured to optimize the uniformity and repeatability of the thickness of the ILD layers. It should be noted that the total number of portions of the guardian feature 70 and the total number of ILD layers above the semiconductor device portion 12 is determined according to the requirements of the particular semiconductor device application being implemented.

Figure 7:
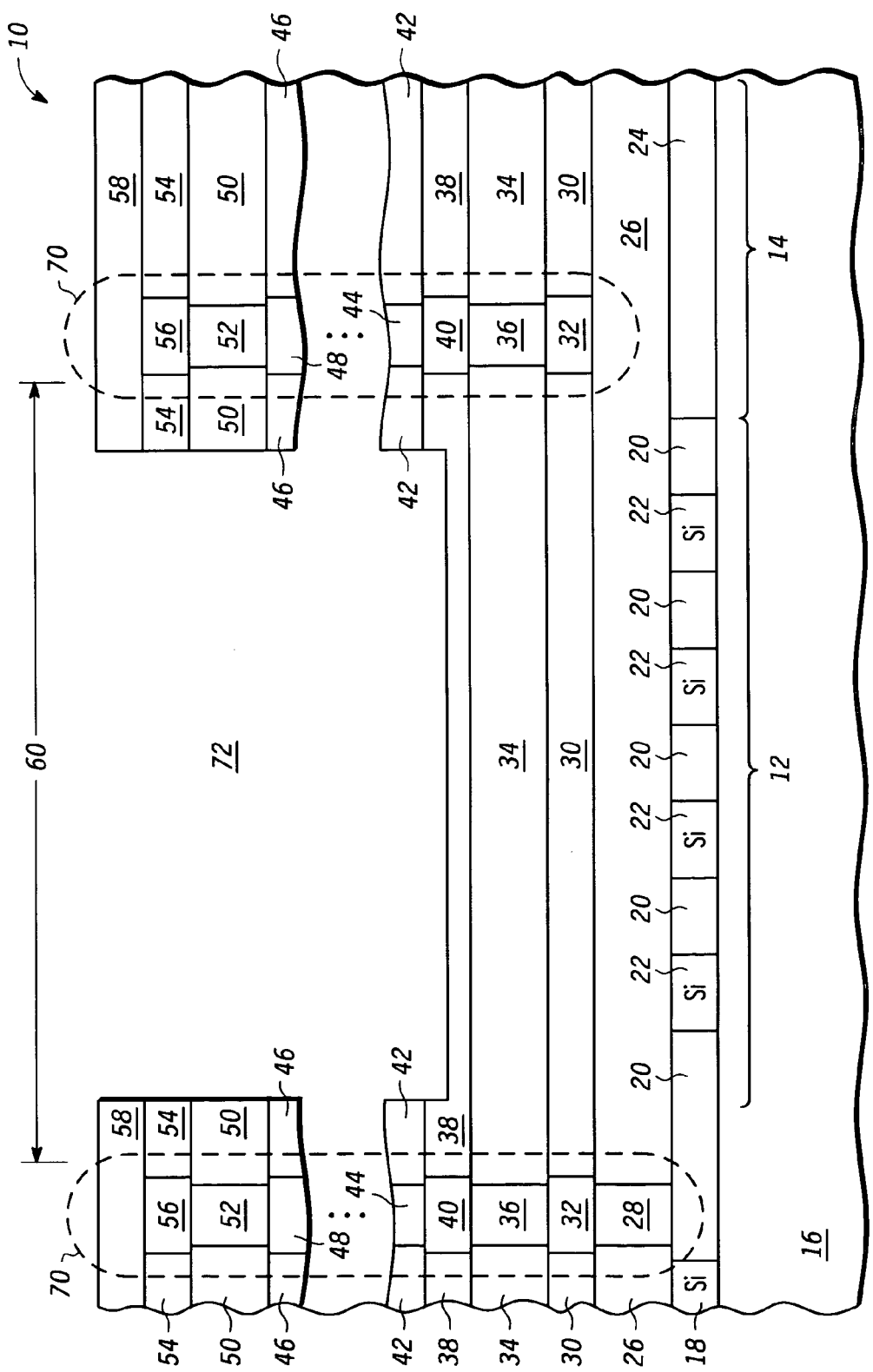
FIG. 7 is a cross-sectional view of the semiconductor device having the guardian feature manufactured according to another embodiment of the present disclosure.

FIG. 7 is a cross-sectional view of the semiconductor device portion 12 having the guardian feature 70 manufactured according to another embodiment of the present disclosure. In the embodiment of FIG. 7, an opening 72 is formed within one or more of the ILD layers within the region 60 to tailor an electromagnetic property of the window within the guardian feature. Subsequent to formation of opening 72, an optical fiber, or laser source or any arbitrary heterointegrated structure (not shown) can be placed in proximity of opening 72, as may be required for a particular semiconductor application.

Opening 72 can be formed using various patterning and etching techniques, and in particular, techniques suitable for etching the various ILD layers. Opening 72 further provides a remainder portion of the ILD layers having a thickness designated by reference numeral 74. The performance of the semiconductor device portion 12 is influenced by the remainder thickness 74 and its constituent material properties. Depending upon design, reducing the number of interfaces within the window may increase an amount of light passage into the semiconductor device portion 12.

Accordingly, a uniformity and repeatability of the thickness 74 are critical to the efficiency of the semiconductor device portion 12. Guardian feature 70 is configured to optimize the uniformity and repeatability of the thickness 74. Furthermore, guardian feature 70 advantageously provides protection against contaminant diffusion into other portions of the device that could result from removal of the passivation and ILD layers during formation of the window.

As discussed herein, the present embodiments provide methods for manufacturing high quality semiconductor devices, wherein the key interaction of the device is with a source or load for an electromagnetic signal oriented at a normal or near normal incidence relative to one or more devices on a wafer. The wafer can comprise, for example, a silicon-on-insulator (SOI) wafer. In addition, the methods provide steps for improving the manufacturability of semiconductor devices incorporating such an optical grating coupler with a waveguide. Furthermore, the methods of the present embodiments are compatible with standard CMOS silicon processes used extensively in manufacturing today. Moreover, the methods are scalable with the continued scaling of CMOS technology. Still further, the methods of the present embodiments enable the integration of optics and electronics on a single silicon chip.

Accordingly, the embodiments disclosed herein provide one or more integrations that present low-cost methods for manufacturing semiconductor devices of arbitrary dimension. As discussed herein, the embodiments provide a method for how the ILD dielectric stacks can be optimized to improve efficiency. Furthermore, the methods include a guardian feature approach to ensure that dielectrics overlying the grating coupler do not suffer from excessive dishing during one or more polishing steps, such as CMP. Moreover, the methods enable the manufacturability of a grating coupler that is easily integrated with CMOS electronics, repeatable, and highly efficient.

The methods of the present embodiments can be used in a number of RF or optoelectronic device applications. In addition, the methods can be used to optically enable internal integrated circuit, module, or system level devices, such as enabling optical clock-tree routing or optical chip-chip interconnect. Still further examples include high end microprocessor devices, high end optical network communication devices, and replacements for optical passive elements.

In the foregoing specification, the disclosure has been described with reference to various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for making a semiconductor device, comprising:

providing a semiconductor substrate having an active semiconductor layer;

forming a semiconductor device in a first portion of the active semiconductor layer and forming one of a waveguide and detector in a second portion of the active semiconductor layer adjacent the first portion, wherein the semiconductor device includes regions of alternating low index of refraction and high index of refraction material form an optical grating;

forming a first dielectric layer over the semiconductor substrate;

forming a first metal layer substantially around and adjacent to the semiconductor device in the first portion of the active semiconductor layer while leaving a portion of the first dielectric layer over the semiconductor device in the first portion of the active semiconductor layer and over the waveguide or detector in the second portion of the active semiconductor layer, wherein the first metal layer includes a circular shape having one or more discontinuities, further wherein a minimal proximity of the first metal layer to the semiconductor device in the first portion of the active semiconductor layer and the waveguide or detector in the second portion of the active semiconductor layer is selected to substantially eliminate any undesirable optical interference between the same;

forming a second dielectric layer over the semiconductor layer; and forming a second metal layer over and substantially aligned to the first metal layer and to surround an area overlying the semiconductor device in the first portion of the active semiconductor layer, the second metal layer further including a circular shape without having a discontinuity.

2. The method of claim 1, further comprising:

etching the portion of the first dielectric layer and the second dielectric layer over the semiconductor device in the first portion of the active semiconductor layer to form an opening over the semiconductor device in the first portion of the active semiconductor layer.

3. The method of claim 2, wherein the first metal layer is a contact layer.

4. The method of claim 2, wherein the first metal layer is a via layer.

5. The method of claim 2, wherein the first metal layer is an interconnect layer.

6. The method of claim 2, further comprising placing one of an optic fiber, or a heterogeneous electromagnetic source, or a heterogeneous electromagnetic load in proximity of the opening.

* * * * *